(12) United States Patent
Choi et al.

(10) Patent No.: US 12,198,923 B2
(45) Date of Patent: Jan. 14, 2025

(54) SUBSTRATE PROCESSING METHOD AND SUBSTRATE PROCESSING SYSTEM

(71) Applicants: Semes Co., Ltd., Cheonan-si (KR); Samsung Electronics Co., Ltd., Suwon-si (KR)

(72) Inventors: Hae-Won Choi, Daejeon (KR); Anton Koriakin, Cheonan-si (KR); Sangjine Park Park, Suwon-si (KR); Keonyoung Kim, Yongin-si (KR); Sukhoon Kim, Seongnam-si (KR); Seohyun Kim, Hwaseong-si (KR); Young-Hoo Kim, Yongin-si (KR); Kuntack Lee, Suwon-si (KR); Jihoon Jeong, Seongnam-si (KR)

(73) Assignees: Semes Co., Ltd., Cheonan-si (KR); Samsung Electronics Co., Ltd., Suwon-si (KR)

( * ) Notice: Subject to any disclaimer, the term of this patent is extended or adjusted under 35 U.S.C. 154(b) by 296 days.

(21) Appl. No.: 17/660,449

(22) Filed: Apr. 25, 2022

(65) Prior Publication Data
US 2022/0415643 A1 Dec. 29, 2022

(30) Foreign Application Priority Data
Jun. 29, 2021 (KR) ........................ 10-2021-0085124

(51) Int. Cl.
*H01L 21/02* (2006.01)
*C11D 1/72* (2006.01)
(Continued)

(52) U.S. Cl.
CPC ............ *H01L 21/0206* (2013.01); *C11D 1/72* (2013.01); *C11D 3/43* (2013.01);
(Continued)

(58) Field of Classification Search
CPC ........... H01L 21/0206; H01L 21/67034; H01L 21/67051; H01L 21/67028;
(Continued)

(56) References Cited

U.S. PATENT DOCUMENTS

| 7,473,517 B2 | 1/2009 | Chang et al. |
| 7,789,971 B2 | 9/2010 | Kevwitch |

(Continued)

FOREIGN PATENT DOCUMENTS

| JP | 2003-140359 A | 5/2003 |
| JP | 2006-030483 A | 2/2006 |
| KR | 2021-0066204 A | 6/2021 |

*Primary Examiner* — Erin F Bergner
(74) *Attorney, Agent, or Firm* — DALY, CROWLEY, MOFFORD & DURKEE, LLP

(57) ABSTRACT

In a substrate processing method, a rinse process using a rinse solution is performed on a development-processed photoresist pattern on a substrate. A substitution process including a first substitution step using a mixed solution of a non-polar organic solvent and a surfactant and a second substitution step using the non-polar organic solvent is performed on the substrate. The substitution process is performed a plurality of times until the rinse solution remaining on the substrate is less than a predetermined value. A supercritical fluid drying process is performed on the substrate to dry the non-polar organic solvent remaining on the substrate.

19 Claims, 8 Drawing Sheets

(51) Int. Cl.
*C11D 3/43* (2006.01)
*H01L 21/67* (2006.01)

(52) U.S. Cl.
CPC .. *H01L 21/67034* (2013.01); *H01L 21/67051* (2013.01); *C11D 2111/22* (2024.01)

(58) Field of Classification Search
CPC ........... H01L 21/67173; H01L 21/6719; H01L 21/67196; H01L 21/67742; H01L 21/02057; H01L 21/0273; H01L 21/6708; C11D 1/72; C11D 3/43; C11D 11/0047; C11D 1/66; C11D 3/181; C11D 11/0064; G03F 7/322; G03F 7/40; G03F 7/3021; G03F 7/32; F26B 5/005
See application file for complete search history.

(56) References Cited

U.S. PATENT DOCUMENTS

| | | |
|---|---|---|
| 8,026,047 B2 | 9/2011 | Namatsu et al. |
| 9,506,695 B2 | 11/2016 | Kim et al. |
| 2006/0003271 A1 | 1/2006 | Clark et al. |
| 2008/0039356 A1* | 2/2008 | Palmer ................. C11D 7/3209 510/424 |
| 2010/0154826 A1* | 6/2010 | Printz ............... H01L 21/67028 134/18 |
| 2016/0289455 A1* | 10/2016 | Inaoka ................... C11D 3/162 |
| 2018/0373154 A1* | 12/2018 | Choi ................... H01L 21/0274 |

\* cited by examiner

SUBSTRATE PROCESSING METHOD AND SUBSTRATE PROCESSING SYSTEM

PRIORITY STATEMENT

This application claims priority under 35 U.S.C. § 119 to Korean Patent Application No. 10-2021-0085124, filed on Jun. 29, 2021 in the Korean Intellectual Property Office (KIPO), the contents of which are herein incorporated by reference in their entirety.

BACKGROUND

1. Field

Example embodiments relate to a substrate processing method and a substrate processing system. More particularly, example embodiments relate to a substrate processing method of cleaning and drying a substrate and a substrate processing apparatus for performing the same.

2. Description of the Related Art

After performing a developing process of an EUV photoresist layer, a cleaning for removing contaminants on a substrate and a drying process using a supercritical fluid to the substrate may be performed. After the cleaning process is performed on the substrate, the substrate may be transferred to a supercritical drying apparatus while a cleaning solution including deionized water remains on the substrate. During the transfer of the substrate, the cleaning solution may melt a photoresist pattern on the substrate to generate a residual material such as resin, and during the drying process, the deionized water and the supercritical fluid may react, resulting in local defects and pattern collapse.

SUMMARY

Example embodiments provide a substrate processing method that can efficiently dry a substrate without collapsing of a pattern after development in a photo process.

Example embodiments provide a substrate processing system for performing the substrate processing method.

According to example embodiments, in a substrate processing method, a rinse process using a rinse solution is performed on a development-processed photoresist pattern on a substrate. A substitution process including a first substitution step using a mixed solution of a non-polar organic solvent and a surfactant and a second substitution step using the non-polar organic solvent is performed on the substrate. The substitution process is performed a plurality of times until the rinse solution remaining on the substrate is less than a predetermined value. A supercritical fluid drying process is performed on the substrate to dry the non-polar organic solvent remaining on the substrate.

According to example embodiments, a substrate processing method, a substrate on which an exposed photoresist layer is coated is loaded into a first process chamber. A chemical process using a developer is performed on the substrate. A rinse process using a rinse solution is performed on the substrate. A mixed solution of a non-polar organic solvent and a surfactant is supplied on the substrate to perform a first substitution step. The non-polar organic solvent is supplied on the substrate to perform a second substitution step. The substrate is loaded into a second process chamber. A supercritical fluid drying process is performed on the substrate.

According to example embodiments, a substrate processing system includes a cleaning apparatus configured to clean a substrate in a first process chamber and a substrate drying apparatus configured to dry the substrate in a second process chamber. The substrate cleaning apparatus includes a first substrate support configured to support the substrate, a nozzle unit configured to spray a chemical solution onto the substrate, and an exhaust unit configured to exhaust the chemical solution scattered from the substrate. The substrate cleaning apparatus performs a rinse process of supplying a rinse solution onto the substrate to clean a developer remaining on the substrate. The substrate cleaning apparatus performs a substitution process of substituting the rinse solution remaining on the substrate with a non-polar organic solvent. The substrate cleaning apparatus performs the substitution process a plurality of times until the rinse solution remaining on the substrate is less than a predetermined value. Each of the substitution processes includes a first substitution step using a mixed solution of a non-polar organic solvent and a surfactant and a second substitution step using the non-polar organic solvent.

According to example embodiments, after an exposure process is performed on a substrate on which a photoresist layer is coated, the substrate may be loaded into a first process chamber to perform a development process. A chemical process may be performed on the substrate in the first process chamber to develop the photoresist layer, a rinse process using a rinse solution such as deionized water may be performed on a development-processed photoresist pattern, and a substitution process may be performed to substitute the rinse solution on the substrate with a non-polar organic solvent. The substitution process may be performed a plurality of times until the deionized water within the rinse solution remaining on the substrate is less than a predetermined value. Each of the substitution processes may include a first substitution step using a mixed solution of a non-polar organic solvent and a surfactant and a second substitution step using the non-polar organic solvent.

The deionized water on the entire surface of the substrate may be substituted with the non-polar organic solvent by the substitution process to effectively remove the deionized water remaining on the substrate. In addition, since the non-polar organic solvent has a high substitution rate with a supercritical fluid in a following supercritical fluid drying process, a supercritical fluid drying performance of the substrate may be improved. Note that the deionized water remaining on the substrate may not be well extracted by supercritical fluids (e.g., $CO_2$), which can cause localized defects.

Thus, in the process of drying the substrate using the supercritical fluid after the developer treatment during the semiconductor photo process, it may be possible to prevent local defects caused by the presence of the deionized water and collapse of the pattern due to the defects.

BRIEF DESCRIPTION OF THE DRAWINGS

Example embodiments will be more clearly understood from the following detailed description taken in conjunction with the accompanying drawings.

FIG. 1 is a plan view illustrating a substrate processing apparatus in accordance with example embodiments.

FIG. 2 is a cross-sectional view illustrating a substrate cleaning apparatus in accordance with example embodiments.

FIG. 3 is a plan view illustrating the substrate cleaning apparatus of FIG. 2.

FIG. 4 is a cross-sectional view illustrating a substrate drying apparatus in accordance with example embodiments.

FIG. 5 is a flow chart illustrating a substrate processing method in accordance with example embodiments.

FIG. 6 is a flow chart illustrating detailed steps of a substitution process in FIG. 5.

FIG. 7 is a view explaining a state when the substitution process in FIG. 5 is performed once.

FIG. 8 is a graph illustrating a ratio of substitution of a non-polar solvent in deionized water by the substitution processes of FIG. 6.

FIG. 9 is a graph showing changes in a rotation speed of a substrate in first and second substitution steps in FIG. 6.

DETAILED DESCRIPTION OF EXAMPLE EMBODIMENTS

Hereinafter, example embodiments will be explained in detail with reference to the accompanying drawings.

Figure 1:
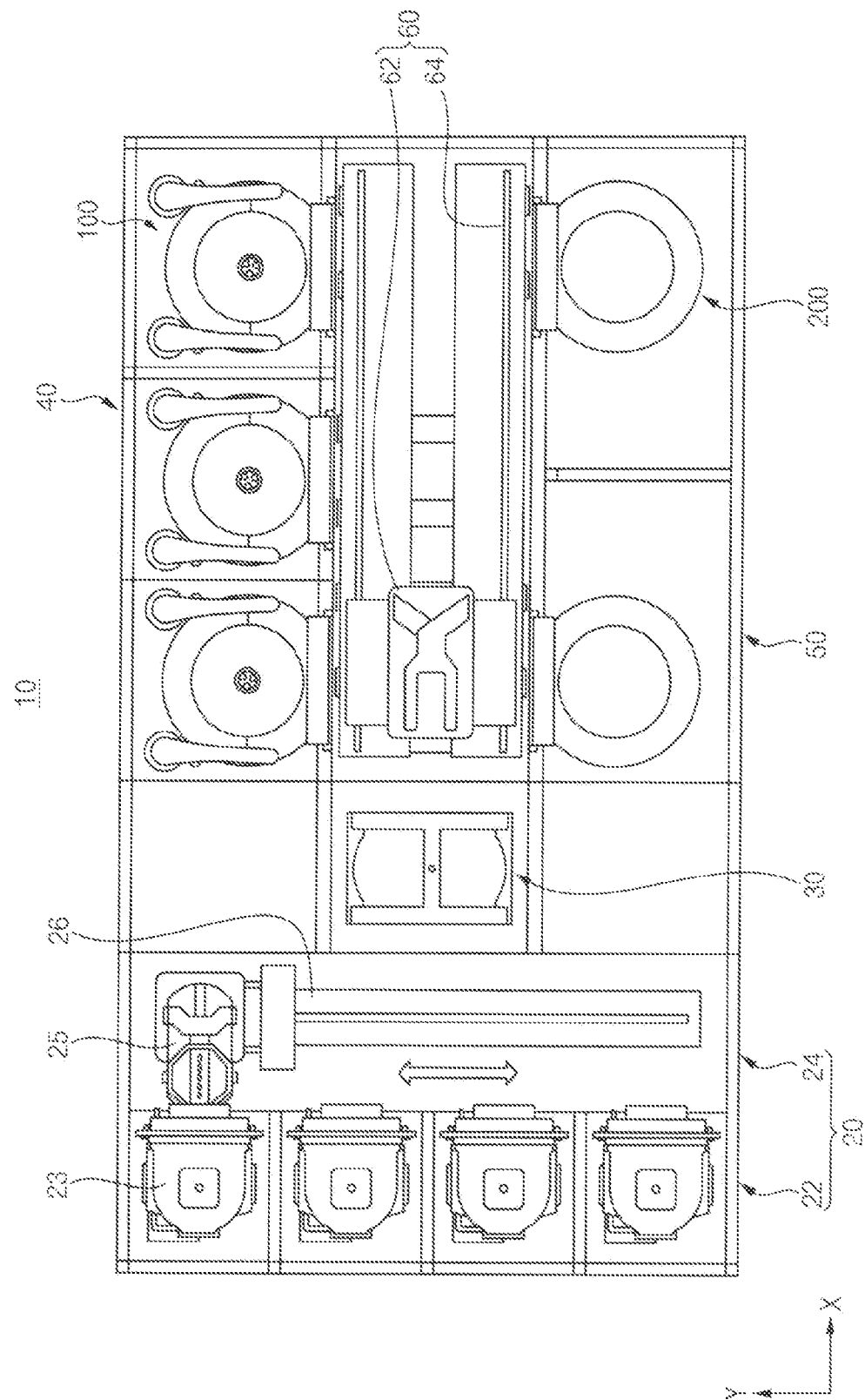
FIGS. 1 to 9 represent non-limiting, example embodiments as described herein.

FIG. 1 is a plan view illustrating a substrate processing apparatus in accordance with example embodiments.

Referring to FIG. 1, a substrate processing apparatus 10 may include an index module 20 configured to load and unload substrates such as wafers, and a process module disposed in one side of the index module 20 and configured to sequentially perform cleaning processes on the wafers. The index module 20 may include a load port 22 and an index frame 24. The process module may include a buffer chamber 30, a first process chamber 40, a second process chamber 50 and a transfer chamber 60.

In example embodiments, the substrate processing system 10 may perform a cleaning process and a drying process on the substrate. For example, the first process chamber 40 may perform the cleaning process in which a chemical process, a rinse process and a substitution process are sequentially performed, and the second process chamber 50 may perform the drying process using a supercritical fluid.

As illustrated in FIG. 1, the load port 22 may be a port on which the substrate is loaded or unloaded, and a plurality of support plates may be arranged in the load port 22 along a Y direction. A front opening unified pod (FOUP) 22 in which a plurality of the wafers W is accommodated, as a wafer carrier may be supported on the support plate. A indexer robot 25 may be movable along an index rail 26 extending in the Y direction, and may transfer the wafer between the wafer carrier 22 on the load port 22 and the process module.

The process module may be disposed in one side of the index module 20 along an X direction. The buffer chamber 30 may be disposed in one side of the transfer frame 24. The transfer chamber 60 may extend in a direction parallel to the X direction from the buffer chamber 30. The first process chambers 40 may be disposed in a first side of the transfer chamber 60. The second process chambers 50 may be disposed in a second side of the transfer chamber 60 opposite to the first side. The first process chambers 40 may be disposed along the X direction. The second process chamber 50 may be disposed along the X direction. Each of the first process chambers 40 may include a plurality of cleaning apparatuses 100 stacked in multiple stages in a vertical direction. Each of the second process chambers 50 may include a plurality of substrate drying apparatuses 200 stacked in multiple stages in the vertical direction.

The buffer chamber 30 may provide a space in which the wafer W to be transferred from the transfer frame 22 to the first process chamber 40 and the wafer W to be transferred from the second process chamber 50 to the transfer frame 22 temporarily stay. In the first process chamber 40, a cleaning process may be performed on the wafer W.

In example embodiments, in the first process chamber (i.e., wet chemical processing chamber) 40, a chemical process, a rinse process and a substitution process may be sequentially performed. In the second process chamber (i.e., supercritical fluid processing chamber) 50, a drying process using a supercritical fluid may be performed on the wafer W on which the cleaning process has been performed.

The transfer chamber 60 for transferring the wafer W may be provided between the first process chamber 40 and the second process chamber 50. A transfer robot 62 may transfer the wafer W while moving along a transfer rail 64 extending in the X direction. The transfer robot 62 may transfer the wafer W placed in the buffer chamber 30 to the first process chamber 40. The transfer robot 62 may transfer the wafer W on which the cleaning process has been performed in the first process chamber 40, to the second process chamber 50. The transfer robot 62 may transfer the wafer W on which the drying process has been performed in the second process chamber 50, to the buffer chamber 30.

In example embodiments, the first process chamber 40 and the second process chamber 50 may be provided to sequentially perform processes on one wafer W. For example, a chemical process, a rinse process and a substitution process may be sequentially performed on the wafer W in the first process chamber 40, and a drying process may be performed in the second process chamber 50. As will be described later, the substitution process may include a first substitution step using a mixed solution of a non-polar organic solvent and a surfactant and a second substitution step using a non-polar organic solvent. The drying process may be performed using a supercritical fluid.

Hereinafter, the substrate processing apparatus 100 of the first process chamber 40 will be described in detail.

Figure 2:
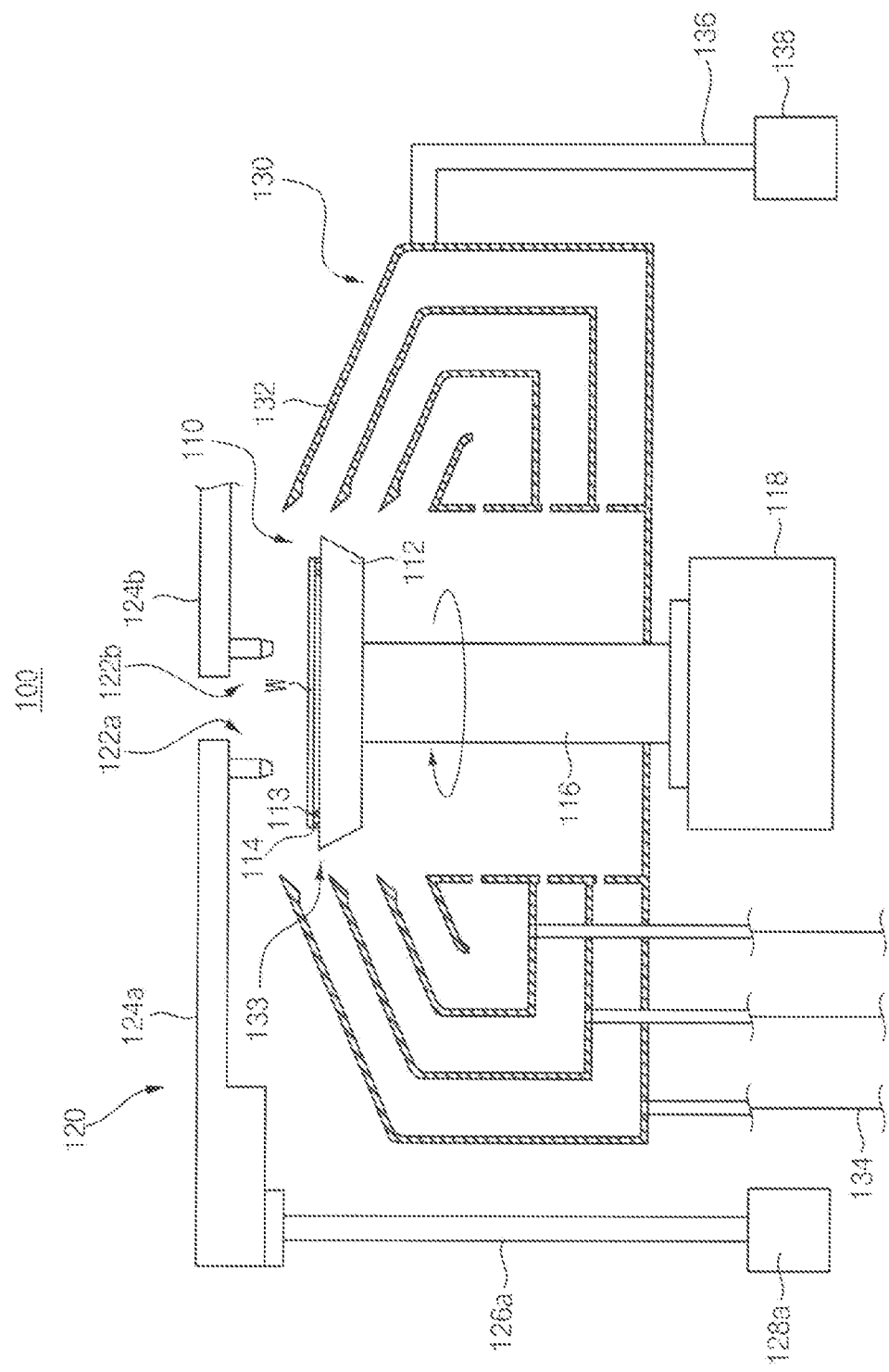
Figure 3:
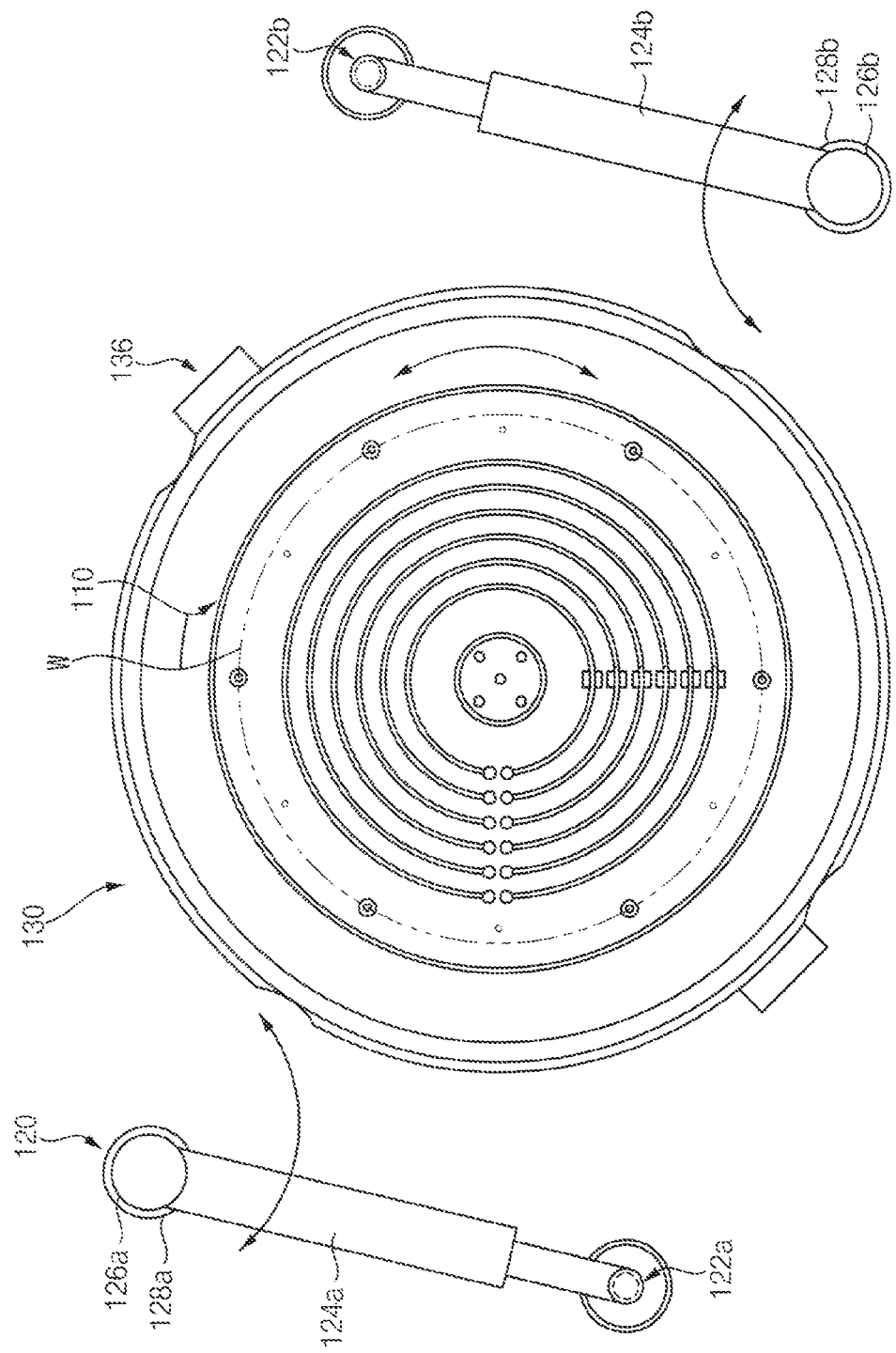

FIG. 2 is a cross-sectional view illustrating a substrate cleaning apparatus in accordance with example embodiments. FIG. 3 is a plan view illustrating the substrate cleaning apparatus of FIG. 2.

Referring to FIGS. 2 and 3, a substrate cleaning apparatus 100 may include a substrate support 110, a nozzle unit 120 and an exhaust unit 130. Additionally, the substrate cleaning apparatus 100 may further include an elevating unit.

In example embodiments, the substrate cleaning apparatus 100 may be an apparatus configured to support a substrate such as a wafer W and perform a chemical process, a rinse process and a substitution process on the substrate. For example, after an exposure process is performed on the substrate W on which a positive (+) photoresist layer is formed, the substrate W on which the exposure process is performed may be loaded into the first process chamber 40 to perform a development process. The substrate cleaning apparatus 100 of the first process chamber 40 may perform a chemical process on the substrate W using a developer such as tetramethylammonium hydroxide (TMAH), and may sequentially perform a rinse process and a substitution process on the substrate W.

Referring to FIGS. 2 and 3, a substrate support 110 may support the substrate W and rotate the substrate W at a desired rotation speed during the cleaning process. The substrate support 110 may include a support plate 112, a support pin 113, a chucking pin 114, a rotation shaft 116 and a driving unit 118.

The support plate 112 may be connected to the rotation shaft 116, and the rotation shaft 116 may rotate by a rotation driving force of the driving unit 118 to rotate the support plate 112. When the support plate 112 rotates, the substrate W may be supported on the support pins 113 and may be fixed on the support plate 112 by the chucking pins 114. For example, the substrate W may be rotated by the substrate support 110 at a rotation speed within a range of 10 rpm to 2000 rpm.

The nozzle unit 120 may include a plurality of nozzles 122*a* and 122*b* for spraying a chemical onto the substrate W. For example, the first nozzle 122*a* may be provided at a first end portion of a first nozzle bar 124*a*, and a second end portion of the first nozzle bar 124*a* opposite to the first end portion may be coupled with a first support shaft 126*a*. The first support shaft 126*a* may be installed to be liftable or rotatable by a first driver 128*a*. As the first nozzle bar 124*a* rotates by the rotation of the first support shaft 126*a*, the first nozzle 122*a* may move between a spraying position and a standby position. The first nozzle 122*a* may spray the chemical while moving between a central region and a peripheral region of the substrate W according to the rotation of the first support shaft 126*a*. The first nozzle 122*a* may spray a developer or a rinse solution. Deionized water may be used as the rinse solution.

Similarly, the second nozzle 122*b* may be provided at a first end portion of a second nozzle bar 124*b*, and a second end portion of the second nozzle bar 124*b* opposite to the first end portion may be coupled with a second support shaft 126*b*. The second support shaft 126*b* may be installed to be liftable or rotatable by a second driver 128*a*. As the second nozzle bar 124*b* rotates by the rotation of the second support shaft 126*b*, the second nozzle 122*b* may move between a spraying position and a standby position. The second nozzle 122*b* may spray a mixture of a non-polar organic solvent and a surfactant or a non-polar organic solvent. Examples of the non-polar organic solvent may be an organic solvent such as alkanes such as decane or dodecane, esters such as debutyl ether or xylene (e.g., o-xylene). The surfactant may be a nonionic surfactant such as SPAN (SPAN20, SPAN80, SPAN85) or TMN (TMN-6, TMN-10).

The exhaust unit 130 may collect the chemical solution supplied to the substrate W. When a chemical is supplied on the substrate W by the nozzle unit 120, the substrate support unit 110 may rotate the substrate W at a desired speed to uniformly supply the chemical to the entire region of the substrate W. When the substrate W rotates, the chemical liquid scattered from the substrate W may be collected by the exhaust unit 130.

The exhaust unit 130 may include a recovery container 132 and a recovery line 134. The recovery container 132 may have an annular ring shape to surround the support plate 112. A plurality of the recovery containers may be sequentially arranged around the support plate 112. A plurality of the recovery containers may be sequentially arranged in a radial direction from the support plate 112. A recovery port 133 through which the chemical scattered from the substrate W is collected may be formed in a space between the recovery containers.

A recovery line 134 may be connected to a bottom surface of the recovery container 132. The chemical exhausted through the recovery line 134 may be circulated to a chemical recycling system (not illustrated) that regenerates the chemical recovered to the recovery container 132.

The elevating unit may include an elevating bar 136 and an elevating driving unit 138. The elevating bar 136 may move up and down by the elevating driving unit 138. The elevating bar 136 may be connected to the outermost collection container 132. The elevating bar 136 may raise and lower the collection container 132 to recover the chemical through any one of a plurality of the recovery ports 133.

The substrate cleaning apparatus 100 may supply a developer such as TMAH onto the substrate W to perform a chemical process of removing foreign substances on the substrate W. Subsequently, the substrate cleaning apparatus 100 may supply a rinse solution such as deionized water to the substrate W to perform a rinse process of cleaning the developer remaining on the substrate W.

Then, the substrate cleaning apparatus 100 may perform a substitution process of replacing the rinse solution remaining on the substrate W after the rinse process with a non-polar organic solvent. The substrate cleaning apparatus 100 may perform a substitution process including a first substitution step using a mixed solution of a non-polar organic solvent and a surfactant and a second substitution step using a non-polar organic solvent a plurality of times. The first substitution step may be a step of mixing the mixture of the non-polar organic solvent and the surfactant with water on the substrate W to form an emulsion. The second substitution step may be a step of providing the non-polar organic solvent on the substrate (W) to replace the emulsion with the non-polar organic solvent. By performing the substitution process, water remaining on the substrate W on which the rinse process has been performed may be substituted with the non-polar organic solvent. The substitution process may be performed repeatedly a plurality of times until the water remaining on the substrate W is less than a preset value (e.g., 100 ppm).

Hereinafter, the substrate drying apparatus 200 of the second process chamber 50 will be described in detail.

Figure 4:
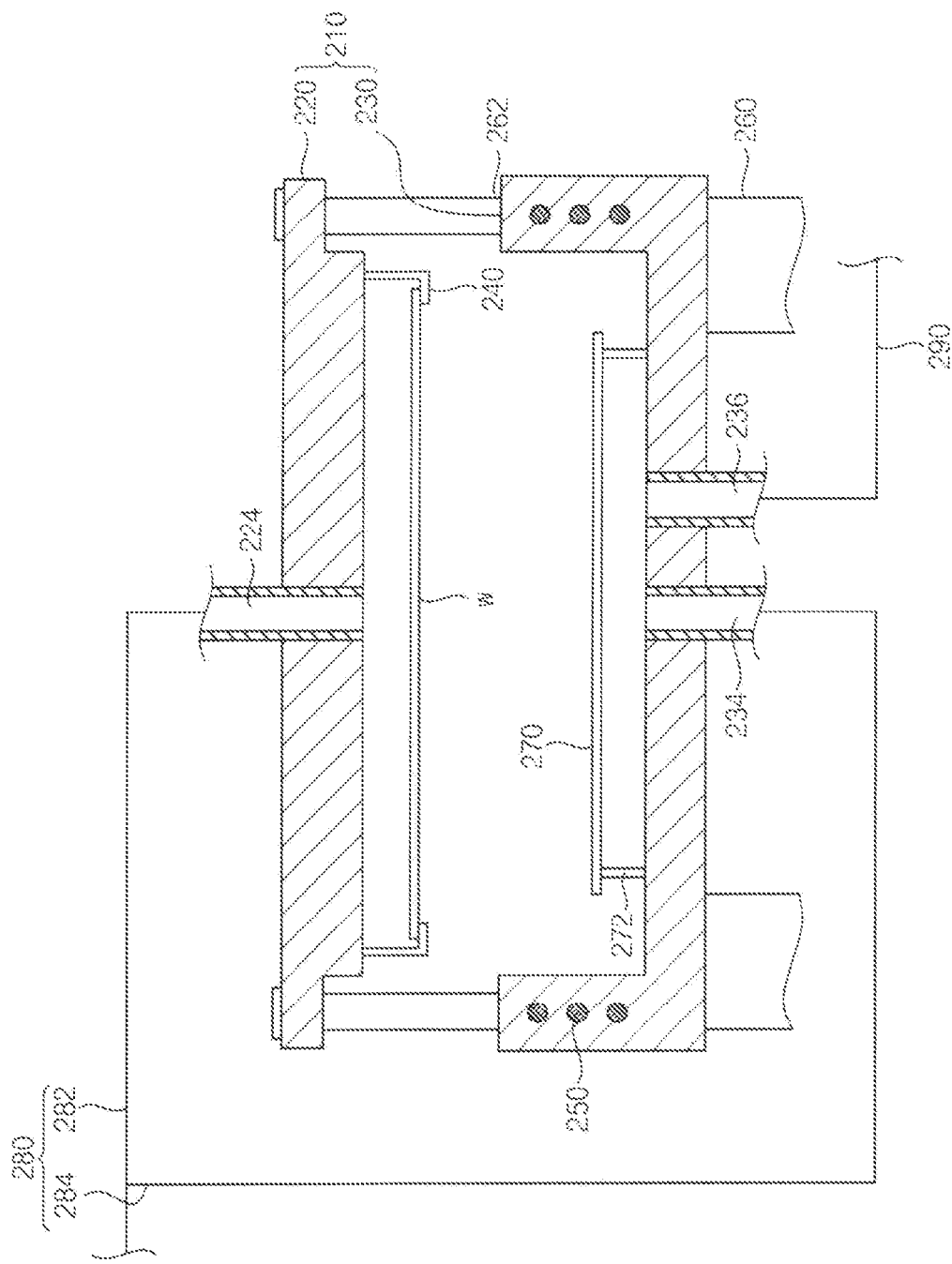

FIG. 4 is a cross-sectional view illustrating a substrate drying apparatus in accordance with example embodiments.

Referring to FIG. 4, a substrate drying apparatus 200 may include a chamber 210, a substrate support 240, an upper supply port 224, a lower supply port 234 and an exhaust port 236. Additionally, the substrate drying apparatus 200 may further include a blocking plate 270.

In example embodiments, the substrate drying apparatus 200 may be an apparatus configured to support a substrate such as a wafer W and process the substrate by a supercritical process using a supercritical fluid. The substrate drying apparatus 200 may dry the substrate W on which a cleaning process has been completed, using the supercritical fluid. The supercritical fluid may include carbon dioxide ($CO_2$) in a supercritical state.

The supercritical fluid may include a material at a temperature and pressure above its critical point having diffusivity, viscosity and surface tension like a gas-like, and solubility like a liquid. For example, the supercritical fluid may include carbon dioxide ($CO_2$), water ($H_2O$), methane ($CH_4$), ethane ($C_2H_6$), propane ($C_3H_8$), ethylene ($C_2H_4$), propylene ($C_3H_6$), methanol ($CH_3OH$), ethanol ($C_2H_5OH$), sulfur hexafluoride ($SF_6$), acetone ($C_3H_6O$), etc.

The chamber 110 may provide a space for drying the substrate. The space may include a process space and a buffer space. The process space may be a space including a liquid solvent on the substrate W, and the buffer space may be a region under the substrate W.

The chamber 210 may include an upper chamber 220 and a lower chamber 230. The upper chamber 210 may include a lower surface. The lower surface of the upper chamber 220 may serve as an upper wall of the chamber 210. The lower chamber 230 may include an upper surface. The upper surface of the lower chamber 120 may serve as a lower wall of the chamber 210.

The upper chamber 220 and the lower chamber 230 may be moved relative to each other by a driving mechanism 260 to engage each other so as to be switchable between a closed position for closing the chamber 210 and an open position for opening the chamber 210. For example, at least one of the upper chamber 220 and the lower chamber 230 may move up and down along a lifting rod 262 to be coupled with or separated from each other. In the open position of the chamber 210, the substrate W may be loaded/unloaded into/from the chamber. In the closed position of the chamber 210, a supercritical drying process of the substrate W may be performed.

The substrate support 240 may be disposed within the chamber 210 and may support the substrate W when the substrate W is loaded into the chamber 210. The substrate support 240 may support the substrate W when the substrate W is loaded/unloaded into the chamber in the open position of the chamber 210. In addition, the substrate support 240 may be disposed within the chamber 210 and may support the substrate W when the substrate W is processed in the chamber. The substrate support 240 may support the substrate W when a supercritical fluid process is performed on the substrate W in the closed position of the chamber 210.

The substrate support 240 may include a pair of support members that support the substrate W at positions spaced apart from the lower surface of the upper chamber 220 by a predetermined distance. Each of the support members may include a vertical rod extending downward from the lower surface of the upper chamber 220 and a horizontal rod extending in a horizontal direction from one end of the vertical rod. Accordingly, the pair of support members may support edge regions of the substrate W, respectively.

In example embodiments, the upper supply port 224 may be provided in the upper chamber 220. The upper supply port 224 may be provided in a central region of the upper chamber 220 to extend in a vertical direction. The upper supply port 224 may be connected to a gas supply (not illustrated) by an upper supply line 282 of a supply line 280. The supercritical fluid may be supplied to the process space positioned above the substrate W through the upper supply port 224.

The lower supply port 234 may be provided in the lower chamber 230. The lower supply port 234 may be provided in a central region of the lower chamber 230 to extend in the vertical direction. The lower supply port 234 may be connected to the gas supply by a lower supply line 284 of the supply line 280. The supercritical fluid may be supplied to the buffer space positioned below the substrate W through the lower supply port 234.

The exhaust port 236 may be provided in the lower chamber 230. The exhaust port 236 may be provided in the central region of the lower chamber 230 adjacent to the lower supply port 224 to extend in the vertical direction. The exhaust port 236 may exhaust the fluid used in the supercritical fluid process from the chamber 210. The exhaust fluid may include a supercritical fluid in which a non-polar organic solvent remaining on the substrate W is dissolved. The fluid exhausted from the exhaust port 236 may be supplied to a regeneration device to be separated into a supercritical fluid and the non-polar organic solvent.

The blocking plate 270 may be disposed between the upper surface of the lower chamber 230 and the substrate W. The blocking plate 270 may be installed to be spaced apart from the upper surface of the lower chamber 230 by a predetermined distance. The blocking plate 270 may be fixed on the upper surface of the lower chamber 230 by a support rod 272. The blocking plate 270 may include a plate having a predetermined thickness occupying a predetermined space in the buffer space. The blocking plate 270 may block direct injection of the supercritical fluid from the lower supply port 234 to a lower surface of the substrate W.

Additionally, a volume of the buffer space may be reduced by the blocking plate 270. The volume of the buffer space may be smaller than a volume of the process space. Accordingly, the amount of the supercritical fluid present in the buffer space under the substrate W may be relatively less than the amount of the supercritical fluid present in the process space above the substrate W. As a structure such as the blocking plate 270 is arranged in the buffer space under the substrate W, the amount of the supercritical fluid used in the drying process may be reduced while maintaining process performance to thereby reduce process time.

In example embodiments, the substrate drying apparatus 200 may include a heater 250 provided in at least one of the upper chamber 220 and the lower chamber 230 of the chamber 210. The heater may heat the inside of the chamber to maintain the temperature of the supercritical fluid supplied into the chamber above the critical temperature.

Hereinafter, a method of processing a substrate using the substrate processing system of FIG. 1 will be described.

Figure 5:
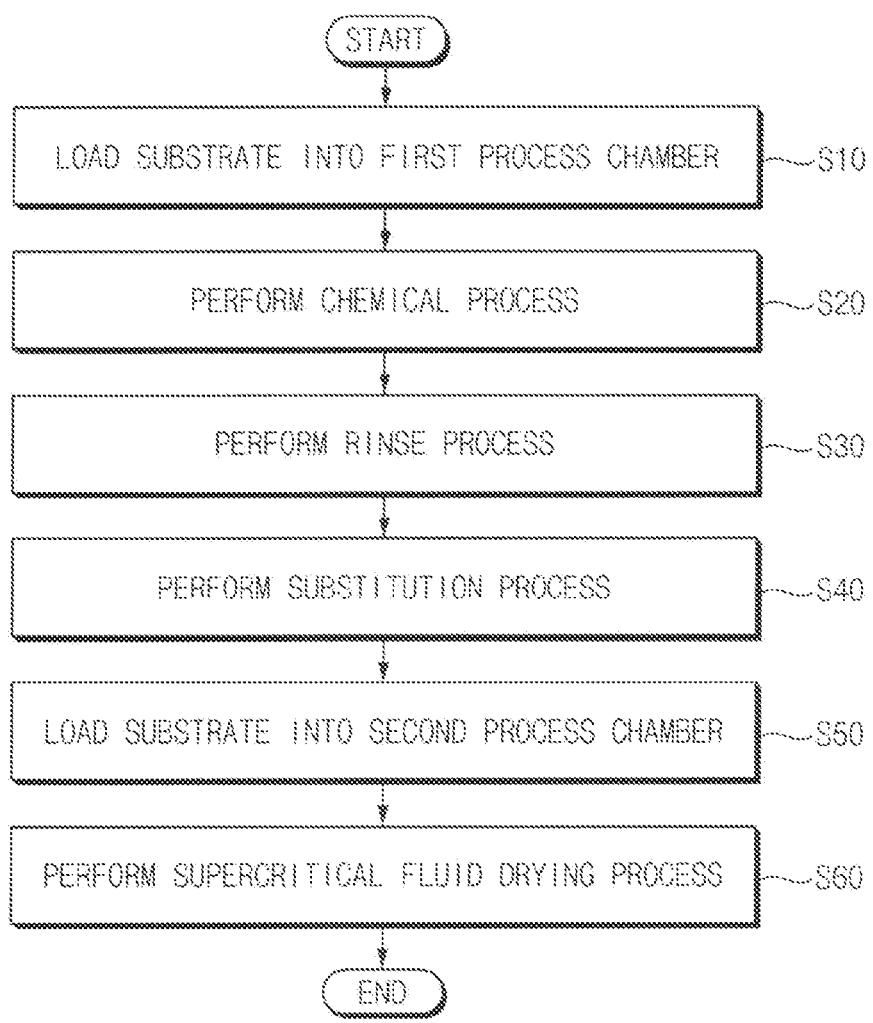
Figure 6:
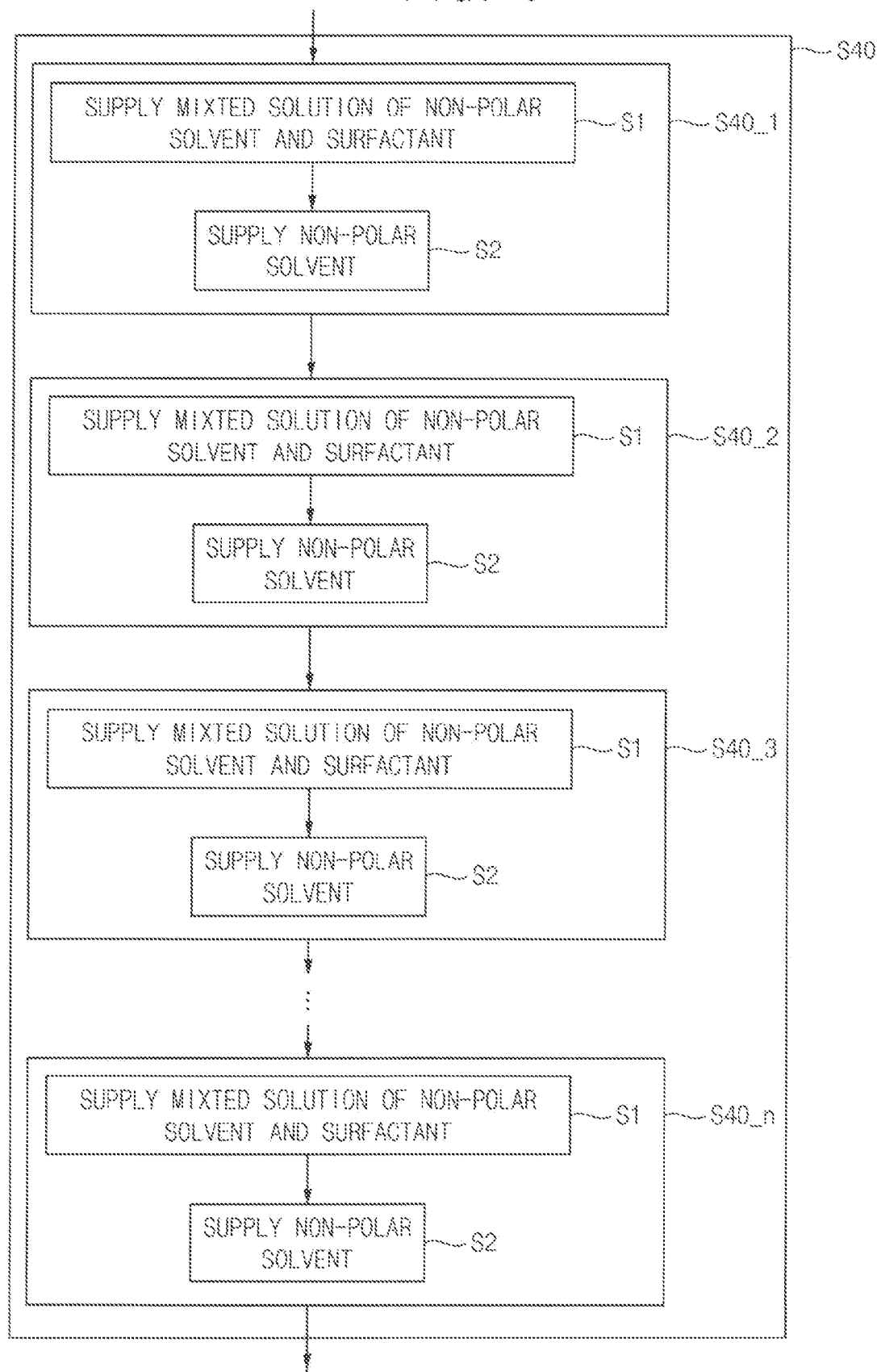
Figure 7:
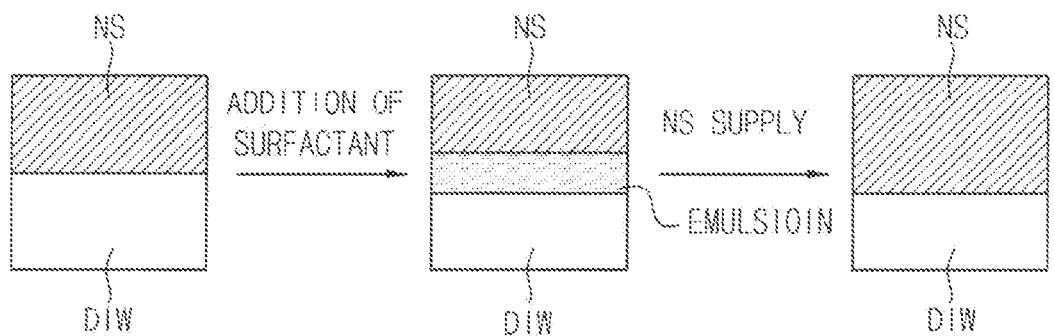
Figure 8:
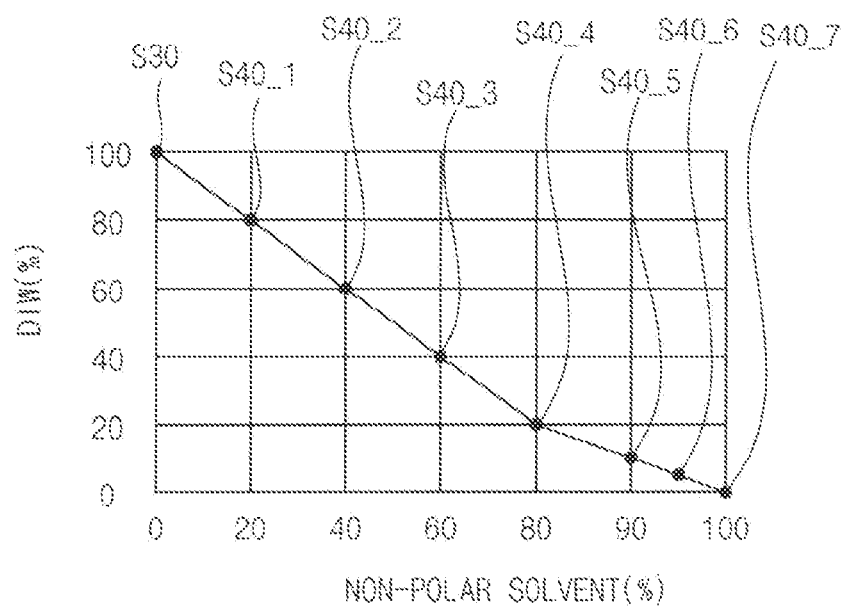
Figure 9:
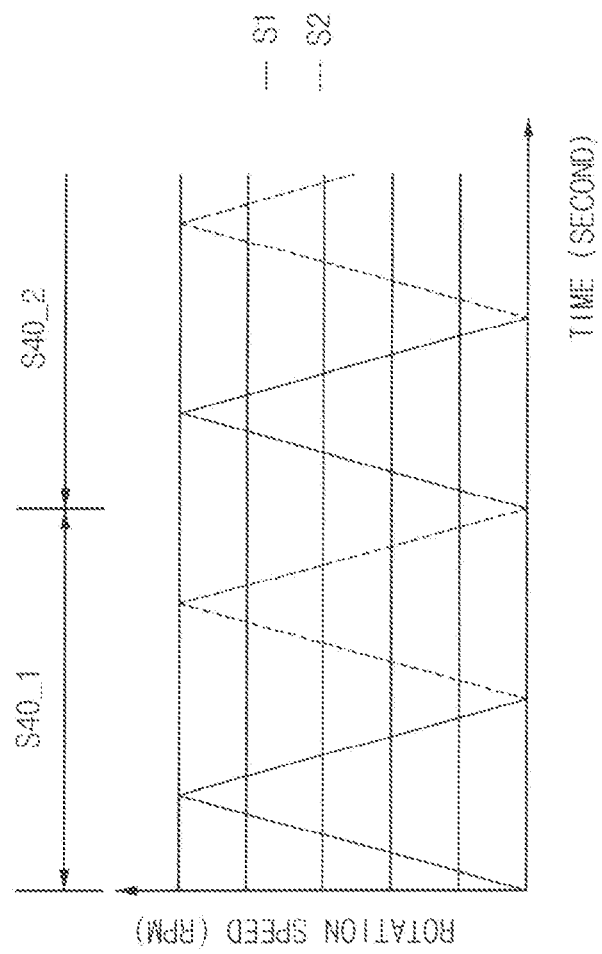

FIG. 5 is a flow chart illustrating a substrate processing method in accordance with example embodiments. FIG. 6 is a flow chart illustrating detailed steps of a substitution process in FIG. 5. FIG. 7 is a view explaining a state when the substitution process in FIG. 5 is performed once. FIG. 8 is a graph illustrating a ratio of substitution of a non-polar solvent in deionized water by the substitution processes of FIG. 6. FIG. 9 is a graph showing changes in a rotation speed of a substrate in first and second substitution steps in FIG. 6.

Referring to FIGS. 1 to 9, a substrate W may be loaded into a first process chamber 40 (S10).

In example embodiments, after an exposure process is performed on the substrate W coated with a photoresist layer, the substrate W may be loaded into the first process chamber 40 to perform a development process.

For example, after a positive (+) photoresist layer is coated on the substrate W, an exposure process using EUV light may be performed on the photoresist layer. The substrate W on which the exposure process has been performed may be accommodated in a wafer carrier (FOUP), and the wafer carrier may be transferred on a support plate of a load port 22 by an overhead hoist transport (OHT). The substrate W may be loaded onto a substrate support 110 of a substrate cleaning apparatus 100 in the first process chamber 40 through an index frame 22 and a buffer chamber 30.

Then, a chemical process may be performed on the substrate W in the first process chamber 40 to develop the photoresist layer (S20), and a rinse process using a rinse solution may be performed on a development-processed photoresist pattern (S30), and a substitution process of replacing the rinse solution on the substrate W with a non-polar organic solvent may be performed (S40).

In example embodiments, a chemical process may be performed on the substrate W using a developer such as tetramethylammonium hydroxide (TMAH). A nozzle unit 120 of the substrate cleaning apparatus 100 may spray the developer onto the photoresist layer on the substrate W to dissolve a resist region exposed to EUV light.

Then, the nozzle unit 120 of the substrate cleaning apparatus 100 may spray a rinse solution such as deionized water on the substrate W to wash the developer remaining on the substrate W.

Then, a substitution process of replacing the rinse solution remaining in the photoresist pattern on the substrate W with a non-polar organic solvent may be performed (S40).

In the substitution process (S40), the nozzle unit 120 of the substrate cleaning apparatus 100 may sprays a mixture of a non-polar organic solvent (NS) and a surfactant on the substrate (W) to perform the first substitution step (S1) and the nozzle unit 120 of the substrate cleaning apparatus 100 may spray a non-polar organic solvent (NS) onto the substrate (W) to perform a second substitution step (S2). Examples of the non-polar organic solvent may be an organic solvent such as alkanes such as decane or dodecane, esters such as debutyl ether or xylene (e.g., o-xylene). The surfactant may be a nonionic surfactant such as SPAN (SPAN20, SPAN80, SPAN85) or TMN (TMN-6, TMN-10). For example, a ratio of the non-polar organic solvent in the mixed solution sprayed on the substrate W in the first substitution step (S1) is within a range of 90% to 99.5%, and a ratio of the surfactant is within a range of 0.5% to 9.5%.

As illustrated in FIG. 6, a plurality of substation processes (S40_1, S40_2, S40_3, . . . , S40_n) may be performed. Each of the substitution processes (S40_1, S40_2, S40_3, . . . , S40_n) may include a first substitution step (S1) using a mixture of a non-polar organic solvent and a surfactant and a second substitution step (S2) using a non-polar organic solvent.

Referring to FIG. 7, in the first substitution step (S1), a non-polar organic solvent (NS) may be supplied to deionized water (DIW) on the substrate (W) and a surfactant may be added to form an emulsion portion. The deionized water remaining on the substrate W after the rinse process may be mixed with a mixed solution of the non-polar organic solvent (NA) and the nonionic surfactant to form a reverse micelle emulsion. In the second substitution step (S2), a non-polar organic solvent (NS) may be supplied on the substrate (W) to replace the emulsion portion with the non-polar organic solvent (NS). Accordingly, a portion of the deionized water (DIW) may be replaced with the non-polar organic solvent (NS) through one substitution process.

In example embodiments, the substitution process may be performed a plurality of times until the deionized water DIW content remaining on the substrate W is less than a predetermined value (e.g., 100 ppm). For example, as illustrated in FIG. 8, all of the deionized water (DIW) on the substrate W may be replaced with the non-polar solvent (NS) by performing seven replacement processes (S40_1, S40_2, S40_3, . . . , S40_7).

In example embodiments, in order for efficient deionized water (DIW) removal (effective substitution performance) in the substitution process, a rotation speed of the substrate W in the first substitution step (S1) and the second substitution step (S2) may be changed. Additionally, an injection position of a nozzle in the first substitution step (S1) and the second substitution step (S2) may be changed.

As illustrated in FIG. 9, the rotation speed of the substrate (W) in the first substitution step (S1) and the second substitution step (S2) of a first substitution process (S40_1) may be changed within a preset rotation speed (RPM) range. The rotation speed of the substrate W may be changed within a range of a preset rotation speed RPM in the first replacement step S1 and the second replacement step S2 of a second replacement process S40_2.

In particular, an increase/decrease control of the rotation speed may be performed once during the first substitution step S1 of the first substitution process (S40_1). That is, after the rotation speed of the substrate W is increased from an initial rotation speed to the maximum rotation speed while performing the first substitution step S1, the rotation speed may be reduced from the maximum rotation speed to the initial rotation speed. The maximum rotation speed may be within a range of 200 RPM to 1200 RPM. Alternatively, the increase/decrease control of the rotation speed may be performed twice or more during the first substitution step (S1).

Then, the increase/decrease control of the rotation speed may be performed once during the second substitution step (S2). That is, after increasing the rotation speed of the substrate W from the initial rotation speed to the maximum rotation speed while performing the second substitution step S2, the rotation speed may be reduced from the maximum rotation speed to the initial rotation speed. Alternatively, the increase/decrease control of the rotation speed may be performed twice or more during the second substitution step (S2).

At this time, process times of the first substitution step (S1) and the second substitution step (S2) may be changed to have the same or different values. For example, the process times of the first substitution step (S1) and the second substitution step (S2) may be within a range of 5 seconds to 60 seconds.

In the first substitution step (S1) and the second substitution step (S2), while spraying the mixture of the non-polar organic solvent and the surfactant or the non-polar organic solvent through the nozzle, the nozzle may be moved between to a central region and a peripheral region of the substrate W. For example, the nozzle may be moved to scan between −50 degrees and +150 degrees from the center of the substrate W. Accordingly, in the first substitution step (S1) and the second substitution step (S2), the nozzle may reciprocate between specific radial positions of the substrate (W).

The non-polar organic solvent NS may substitute the deionized water DIW on the entire surface of the substrate W by the substitution process to effectively remove the deionized water DIW remaining on the substrate W. In addition, since the non-polar organic solvent has a high substitution rate with the supercritical fluid in a following supercritical fluid drying process, a drying performance of the substrate W may be improved.

For example, decane used as the non-polar organic solvent may have a low evaporation rate (less than 0.7 (BA=1)), low surface tension (less than 25 dyne/cm) and high viscosity (greater than 0.5 Cp). Accordingly, decane may effectively remove the deionized water (DIW) remaining on the substrate (W). In addition, since decane has a relatively low photoresist loss rate (PR loss <3%), even if the substrate W is transferred to the second process chamber 50 while decane remains on the substrate W, damage to a photoresist pattern on the substrate W may be prevented.

Then, the substrate W on which the substitution process has been performed may be loaded into a second process chamber 50 (S50), and a supercritical fluid drying process may be performed on the substrate W in the second process chamber 50 (S60).

In example embodiments, a transfer robot 62 may transfer the substrate W on which the cleaning process has been performed in the first process chamber 40 to the second process chamber 50. The substrate W may be loaded into the second process chamber 50 while the non-polar organic solvent remains on the substrate W.

After the substrate W is loaded onto a substrate support 240 of a substrate drying apparatus 200 in the second process chamber 50, the supercritical drying process may be performed on the substrate W in a closed position of a chamber 210.

For example, after a supercritical fluid is supplied into the chamber 210 through a lower supply port 234, a supercritical fluid may be supplied into the chamber 210 through an upper supply port 224. At the beginning of the supercritical drying process, the supercritical fluid may be supplied into the chamber 210 through the lower supply port 234 so that a pressure in the chamber 210 reaches the critical pressure, and then, the critical fluid may be supplied onto the substrate W in the chamber 210 through the upper supply port 224.

Since the non-polar organic solvent remaining on the substrate W has a high substitution rate with the supercritical fluid, a drying performance of the substrate W in the supercritical fluid drying process may be improved.

Then, the substrate W on which the drying process has been performed in the second process chamber 50 may be transferred to the outside through the buffer chamber 30 and the index module 20. The substrate W on which the developing process has been performed by the substrate processing system 10 may be transferred to an etching apparatus. The etching apparatus may perform an etching process using the photoresist pattern as an etching mask on the substrate W.

The above substrate processing system and substrate processing apparatus may be used to manufacture semiconductor devices including logic devices and memory devices. For example, the semiconductor device may be applied to logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A substrate processing method, comprising:
performing a rinse process using a rinse solution on a development-processed photoresist pattern on a substrate;
performing a substitution process on the substrate, the substitution process including a first substitution step using a mixed solution of a non-polar organic solvent and a surfactant and a second substitution step using the non-polar organic solvent;
performing the substitution process a plurality of times until the rinse solution remaining on the substrate is less than a predetermined value that is greater than zero; and
performing a supercritical fluid drying process on the substrate to dry the non-polar organic solvent remaining on the substrate.

2. The substrate processing method of claim 1, wherein the non-polar organic solvent is an organic solvent including at least one of alkanes, ethers and xylene.

3. The substrate processing method of claim 2, wherein the alkanes organic solvent includes decane or dodecane.

4. The substrate processing method of claim 1, wherein the surfactant includes a nonionic surfactant.

5. The substrate processing method of claim 4, wherein the nonionic 5, surfactant includes SPAN or TMN.

6. The substrate processing method of claim 1, further comprising:
changing a rotation speed of the substrate while supplying the mixed solution or the non-polar organic solvent on the substrate in the first substitution step or the second substitution step.

7. The substrate processing method of claim 1, further comprising:
changing an injection position of a nozzle while supplying the mixed solution or the non-polar organic solvent on the substrate through the nozzle in the first substitution step or the second substitution step.

8. The substrate processing method of claim 7, wherein changing the injection position of the nozzle includes moving the nozzle to scan between a central region and a peripheral region of the substrate.

9. The substrate processing method of claim 1, further comprising:
performing an exposure process on a photoresist layer coated on the substrate; and
processing the exposed photoresist layer with a developer to form the photoresist pattern.

10. The substrate processing method of claim 9, wherein the exposed photoresist layer is processed with the developer including tetramethylammonium hydroxide (TMAH).

11. A substrate processing method, comprising:
loading a substrate on which an exposed photoresist layer is coated into a first process chamber;
performing a chemical process using a developer on the substrate;
performing a rinse process using a rinse solution on the substrate;
supplying a mixed solution of a non-polar organic solvent and a surfactant on the substrate to perform a first substitution step;
supplying the non-polar organic solvent on the substrate to perform a second substitution step;
performing a substitution process of the first substitution process and the second substitution process a plurality of times until the rinse solution remaining on the substrate is less than a predetermined value that is greater than zero;
loading the substrate into a second process chamber; and
performing a supercritical fluid drying process on the substrate.

12. The substrate processing method of claim 11, wherein the non-polar organic solvent is an organic solvent including at least one of alkanes, ethers and xylene.

13. The substrate processing method of claim 11, wherein the surfactant includes SPAN or TMN.

14. The substrate processing method of claim 11, wherein the rinse solution includes deionized water.

15. The substrate processing method of claim 11, further comprising:
changing a rotation speed of the substrate while supplying the mixed solution or the non-polar organic solvent on the substrate in the first substitution step or the second substitution step.

16. The substrate processing method of claim 15, wherein changing the rotation speed of the substrate includes:
increasing the rotation speed of the substrate from an initial rotation speed to a maximum rotation speed; and decreasing the rotation speed of the substrate from the maximum rotation speed to the initial rotation speed.

17. The substrate processing method of claim 11, further comprising:
   changing an injection position of a nozzle while supplying the mixed solution or the non-polar organic solvent on the substrate through the nozzle in the first substitution step or the second substitution step.

18. The substrate processing method of claim 17, wherein changing the injection position of the nozzle includes moving the nozzle to scan between −50 degrees and +150 degrees from the center of the substrate.

19. The substrate processing method of claim 11, wherein the supercritical fluid drying process is performed using carbon dioxide as a supercritical fluid.

* * * * *